United States Patent [19]

Davies et al.

[11] 4,420,344
[45] Dec. 13, 1983

[54] CMOS SOURCE/DRAIN IMPLANT PROCESS WITHOUT COMPENSATION OF POLYSILICON DOPING

[75] Inventors: Roderick D. Davies, Richardson; David B. Scott, Plano, both of Tex.

[73] Assignee: Texas Instruments Incorporated, Dallas, Tex.

[21] Appl. No.: 311,713

[22] Filed: Oct. 15, 1981

[51] Int. Cl.³ .................. H01L 21/263; H01L 21/26
[52] U.S. Cl. .................................... 148/1,5; 29/571; 29/576 B; 148/187; 357/42; 357/91
[58] Field of Search ................. 148/1.5, 187; 29/571, 29/576 B; 357/42, 91

[56] References Cited

U.S. PATENT DOCUMENTS

| | | | |
|---|---|---|---|
| 3,920,481 | 11/1975 | Hu | 148/1.5 |
| 4,108,686 | 8/1978 | Jacobus, Jr. | 148/1.5 |
| 4,149,904 | 4/1979 | Jones | 148/1.5 |
| 4,217,149 | 8/1980 | Sawazaki | 148/1.5 |
| 4,224,733 | 9/1980 | Spadea | 29/571 |
| 4,226,650 | 10/1980 | Takahashi et al. | 148/188 |
| 4,268,321 | 5/1981 | Meguro | 148/1.5 |
| 4,280,272 | 7/1981 | Egawa et al. | 29/571 |
| 4,306,916 | 12/1981 | Wollesen et al. | 148/1.5 |
| 4,314,857 | 2/1982 | Aitken | 357/42 |
| 4,335,504 | 6/1982 | Lee | 29/576 B |

Primary Examiner—Upendra Roy
Attorney, Agent, or Firm—Melvin Sharp; James T. Comfort; Robert Groover, III

[57] ABSTRACT

CMOS source/drain regions of both conductivity types are formed using only a single masking step. One dopant is applied to both types of source/drain regions, and a second dopant is applied at a much higher dose and energy to only one type of source/drain region. Preferably, boron and arsenic are used as the dopants in silicon, since the cooperative diffusion effect causes the boron in the counterdoped source/drain regions to be entirely contained within the arsenic diffusion.

To avoid the erratic etching characteristics of heavily-doped polysilicon under chloro-etch, the patterned photoresist used to pattern the gates and gate-level interconnects is left in place during the P+ source/drain implant. Thus, moderately doped N-type polysilicon may be used, since it is not exposed to compensation by the P+ implant. Since no P+ source/drain mask is required, no double-level photoresist structure is created, and there is consequently no obstacle to reworks. In addition, positive resists may be used in practicing the present invention.

7 Claims, 4 Drawing Figures

CMOS SOURCE/DRAIN IMPLANT PROCESS WITHOUT COMPENSATION OF POLYSILICON DOPING

BACKGROUND OF THE INVENTION

The present invention relates to an improvement in CMOS processing technology, whereby a masking step is saved and improved polysilicon patterning is made possible.

Typically, CMOS processing requires at least four masking steps in addition to those used for NMOS processing, which imposes a great economic disadvantage on CMOS technology. The standard NMOS mask sequence is: (1) Moat (2) threshold-voltage ion implant (3) polysilicon (4) second contact (5) metal (6) POR (Protective Overcoat Removal). By contrast, the normal CMOS process requires at least four additional masks, as follows: (1) Tank (2) moat (3) channel stop (to do channel stopping only between N-channel devices) (4) threshold voltage ion implant (5) polysilicon (6) P+ (for low-sheet-resistance source/drain regions for P channel devices) (7) N+ (source/drain regions for N-channel devices) (8) second contact (9) metal (10) POR.

Thus, it is an object of the present invention to provide a more economical process for fabrication of CMOS devices.

It is a further object of the present invention to provide a process for fabrication of CMOS devices which reduces the number of masking steps required.

One possible way to save a masking step in CMOS processing might be to economize on the two separate masks normally required for the P-type and N-type source/drain regions. However, to do this successfully, it is necessary to find ways to obtain good control of both types of source/drain regions.

It is thus a further object of the present invention to provide a method for formation of both P-type and N-type source/drain regions using only one masking step, while retaining good control of the characteristics of the regions formed.

CMOS processes of varying complexity may be used for fabricating different types of devices. For example, the interconnect technology required for a memory array may be quite simple, whereas that required for a random logic structure (e.g., a microprocessor) may be more complex, and require additional patterned levels. Since acceptance of the simplest processes will also imply economic benefits for the more complex processes, a mask-saving scheme should preferably apply to any CMOS process, whether simple or complex.

It is thus a further object of the present invention to provide a mask-reduction scheme which applies to any CMOS process, whether simple or complex.

One difficulty with polysilicon patterning in the CMOS processing prior art has been that excessive levels of dopant greatly degrade the etching characteristics of the polysilicon. In particular, if the polysilicon is doped to have a sheet resistance much below 50 ohms per square, etching tends to occur along grain boundaries, so that fine-line patterning is no longer possible. This problem is acute with present day etching techniques such as chloro-etching (e.g. plasma etching in $CCl_4$). While it is possible that further etching techniques may be developed to alleviate this problem (e.g. RIE), such texhniques are not now reliably available.

If the polysilicon is to be exposed to the P-type source/drain implant, it must be heavily doped to begin with, with consequent degradation of the etching characteristics, or else the dopant compensation introduced by the P+ source/drain implant will cause the polysilicon to have an unacceptably high sheet resistance.

To avoid exposure of the polysilicon to the P+ source/drain implant, one possibility is to leave the photoresist for the gate patterning step in place. However, this technique, if used in conjunction with prior art source/drain formation techniques, has two major disadvantages: First, the P+ source/drain mask must be spun on over the patterned gate photoresist in place, and the P+ source/drain mask must then be patterned itself. Therefore, if rework on the P+ source/drain mask is necessary, the patterned gate photoresist will also be removed. Since the patterned gate photoresist is self-aligned, it cannot be replaced, and therefore substantial discards will occur in production which could otherwise have been saved by reworking. Second, this technique would appear not to be practical if positive photoresist is used, since dissolution of the exposed P+ source/drain photoresist will also tend to break down the patterned gate photoresist over the gates of P-channel devices. Since positive resists appear to be preferable in the further development of fine-line lithography, this is a serious drawback.

It is thus an object of the present invention to provide a process for forming source/drain regions of either conductivity type in a CMOS structure, which prevents polysilicon regions from being compensated by a source/drain implant.

It is thus a further object of the present invention to provide a process for forming CMOS source/drain regions, which protects polysilicon from being compensated by a source/drain implant, without introducing any non-reworkable steps.

It is a further object of the present invention to provide a process for forming CMOS source/drain regions which permits use of positive photoresists for patterning the polysilicon, and which permits use of only moderately doped polysilicon.

SUMMARY OF THE INVENTION

The present invention uses counterdoping to permit use of a single masking step for both N-type and P-type source/drain regions. The patterned photoresist which is used to define the anisotropically etched N-type polysilicon gate regions is left in place and both N-type and P-type source/drain regions are exposed to a first ion implant. A mask is then applied over the P-type source/drain regions only, and a second implant is applied to form the N-type sources and drains. Polysilicon (which is usually doped N-type) is not exposed to the P+ source/drain implant, the level of doping of the polysilicon remains approximately the same over both N+ and P+ transistors, and need not be increased to offset compensation effects where the P-type implant is applied.

However, such a scheme, if it relies on merely numerical dominance of one of the two dopants applied, does not permit optimal control of the characteristics of the source/drain regions where both implants have been applied. In particular, the diffusion constant of the minority dopant must be less than that of the majority dopant, or else a thin layer of opposite conductivity type will be formed adjacent to the counter doped source/drain region.

In the preferred embodiment of the present invention, a cooperative doping effect is used to greatly facilitate accurate control over the characteristics of counterdoped source/drain regions. It was discovered in bipolar devices that attempts to form double-diffused devices, using boron and arsenic as the dopants, produced base widths narrower than had been expected. It has since been discovered that the diffusivity of boron is greatly suppressed by the presence of arsenic. This effect is applied to great advantage in the present invention. By using boron and aresenic respectively for the minority and majority counterdopants, the diffusivity of the boron is suppressed by the presence of arsenic in the counterdoped source/drain regions. Thus, when the implants are activated, the arsenic diffuses to form an N+ source/drain region of the desired configuration, whereas the boron in the N+ region remains approximately within its area of implantation. Thus, very good control is maintained.

To prevent the boron from forming a localized compensation within the counterdoped region, the dose of arsenic is preferably approximately five times as high as the dose of boron. This in turn implies that the conductivity of the P-type source/drain regions will be rather low. Thus, application of metal silicide layers over source and drain regions, while not necessary to practice the invention, will often be desirable to reduce series resistance. The relevance and application of siliciding techniques is extensively discussed in U.S. Pat. application No. 092,009 (Al Tasch, et al, Metal-Oxide Semiconductor Device Using Metal Silicide Regions to Improve Device speed and Packing Density) of common assignee, which is hereby incorporated by reference.

According to a further embodiment of the present invention, there is provided a process for forming both first-conductivity-type-channel and second-conductivity-type-channel transistors in respective selected areas of a semiconductor surface, said transistors each respectively comprising a gate, a source, and a drain, said process comprising the steps of:

providing a layer of doped first-conductivity-type polysilicon atop said semiconductor surface;

applying a patterned etch mask layer atop said polysilicon layer, said patterned etch mask layer overlying the respective selected locations of said respective gates of said transistors;

anisotropically etching said polysilicon layer except where said polysilicon layer is covered by a portion of said patterned etch mask layer;

implanting a second-conductivity-type dopant in the respective desired locations both of the respective sources and drains both of said second-conductivity-type-channel transistors and of said first-conductivity-type-channel transistors, said patterned etch mask layer not being removed before said second-type implanting step; and implanting a first-conductivity-type dopant in the respective desired locations of said respective sources and drains of said first-type-channel transistors, said first-type dopant being applied at a higher dose than said second-type dopant; said first-type and second-type dopants being selected such that the presence of said first-type dopant within said semiconductor surface reduces the diffusivity of said second-type dopant.

BRIEF DESCRIPTION OF THE DRAWINGS

The present invention will now be more specifically described with reference to the accompanying drawings, wherein.

DESCRIPTION OF THE PREFERRED EMBODIMENTS

Figure 1:
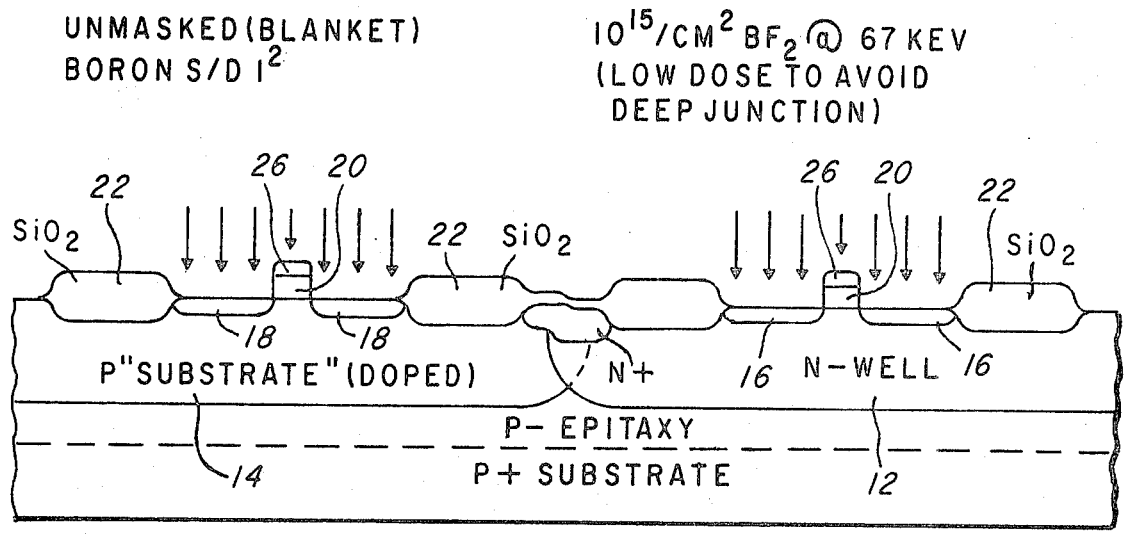
FIG. 1 shows a schematic section of a silicon CMOS device, wherein boron is being implanted into both N-type and P-type source/drain regions in accordance with the present invention.
Figure 2:
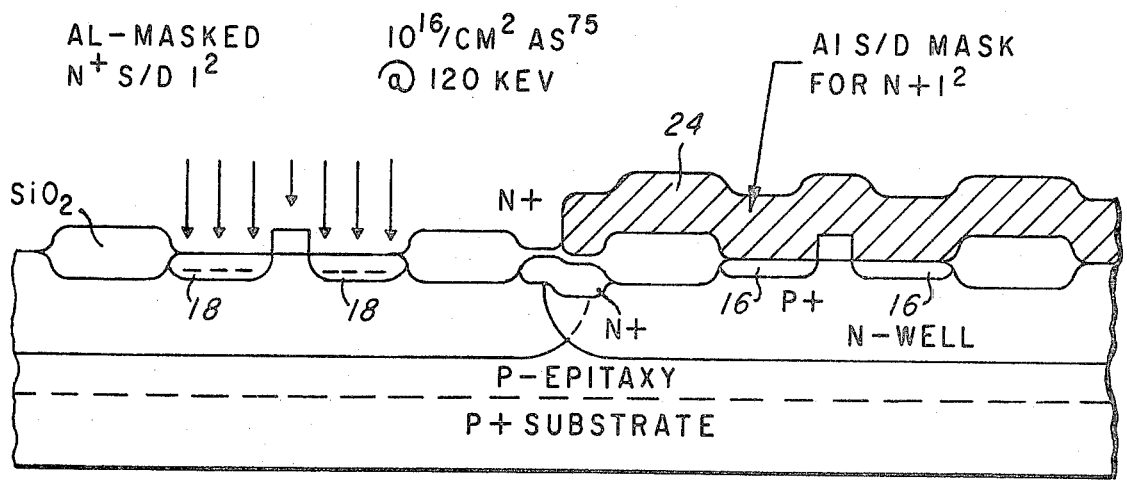
FIG. 2 shows a section of a silicon CMOS device, wherein arsenic is being implanted into only the N-type source/drain regions in accordance with the present invention.

A silicon CMOS device to which the method of the present invention is applied is shown schematically in FIG. 1. A P-channel device 12 and an N-channel device 14 are shown, respectively including regions 16 wherein P-type source/drains must be formed and regions 18 where N-type source/drains must be formed. Gate-regions 20 and oxide regions 22, etc., are also shown atop the surface.

In addition, the patterned photoresist 26, used in a previous conventional processing step to pattern the gate areas 20 by anisotropic etching, is also shown in place. The boron implant is applied first.

Preferably, the boron is implanted at a very low energy. To facilitate accurate control of such a low-energy implantation, boron fluoride is preferably used. The 67 KeV energy of the $BF_2$ implant is approximately equivalent to a 14 KeV energy implant of pure boron, and is more convenient for use with conventional processing equipment. The preferred dose of the boron implant is $2 \times 10^{15}/cm^2$.

The photoresist 26 is then stripped, and mask 24 is applied over the P-type source/drain locations 16. In the preferred embodiment, aluminum is used for the mask 24. This is because the application of a heavy arsenic implant frequently has a strong hardening affect on conventional resists, making them very difficult to remove subsequently. Specifically, 500 nm of Al is preferably deposited. AZ resist is then spun on, the resist is exposed above the N-type source drain regions 18, the exposed resist is ashed and baked, and the aluminum is wet etched in leach (phosphoric and acetic acid) followed by a clean-up solvent.

An arsenic implant is then applied to only the N-type source/drain regions 18. Preferably, the arsenic is applied at a dose of $10^{16}$ per $cm^2$ at an energy of 120 KeV. Thus, not only is the arsenic applied at a five times higher dose than the boron, it is also applied at an effective energy which is almost ten times higher.

The aluminum is then stripped by a conventional aluminum etch such as "leach" solution (followed by clean-up).

A boron dose of $10^{15}/cm^2$ has been actually used in testing the process of the present invention, but this low dose causes a high sheet resistance in the P-type source/drain regions formed (about 200 ohms per square). Thus, increasing the boron dose, to the extent possible without causing localized compensation in the N-type source/drain regions, is desirable. A boron dose of $2 \times 10^{15}/cm^2$ will safely increase conductivity, and doses as high as $4 \times 10^{15}/cm^2$ appear practical. (At such higher doses, the energy of the $BF_2$ implantation is preferably increased somewhat, e.g., to 90 KeV, to avoid localized compensation near the surface of the N-type source/drain regions.) At a dose of $2 \times 10^{15}/cm^2$, the P-type source/drains have a sheet resistance of about 120 ohms per square, whereas the N-type regions have a sheet resistance of about 20 ohms per square. Increasing the arsenic dose permits an even heavier boron dose to be used, but this would also create deeper N-type source/drains, increasing parasitic capacitance and leakage current and degrading device performance. In addition, arsenic doses above about $1.5 \times 10^{16}/cm^2$ are ineffective, due to the limits of solid solubility. Thus, a boron dose between $5 \times 10^{14}/cm^2$ and $5 \times 10^{15}/cm^2$, at an arsenic dose of approximately $10^{16}/cm^2$, is deemed to be within the scope of the present invention. Moreover, a boron dose of $5 \times 10^{14}/cm^2$ to $10^{16}/cm^2$, at an arsenic dose of $5 \times 10^{15}/cm^2$ to $2 \times 10^{16}/cm^2$, is also deemed to be within the scope of the present invention. A boron effective implant energy of 10–30 KeV is also deemed to be within the scope of the invention.

After the implants, 50 nm of oxide is deposited on the regions 16 and 18 by a conventional plasma-assisted CVD process. After further clean-up, densification of the oxide is accomplished by 30 minutes in steam at 700° C. Finally, the wafer is annealled in argon for 20 minutes at 1000° C.

By these steps, the implanted source/drain regions are activated. CMOS processing then proceeds with further conventional steps to form a desired configuration of CMOS devices.

Figure 3:
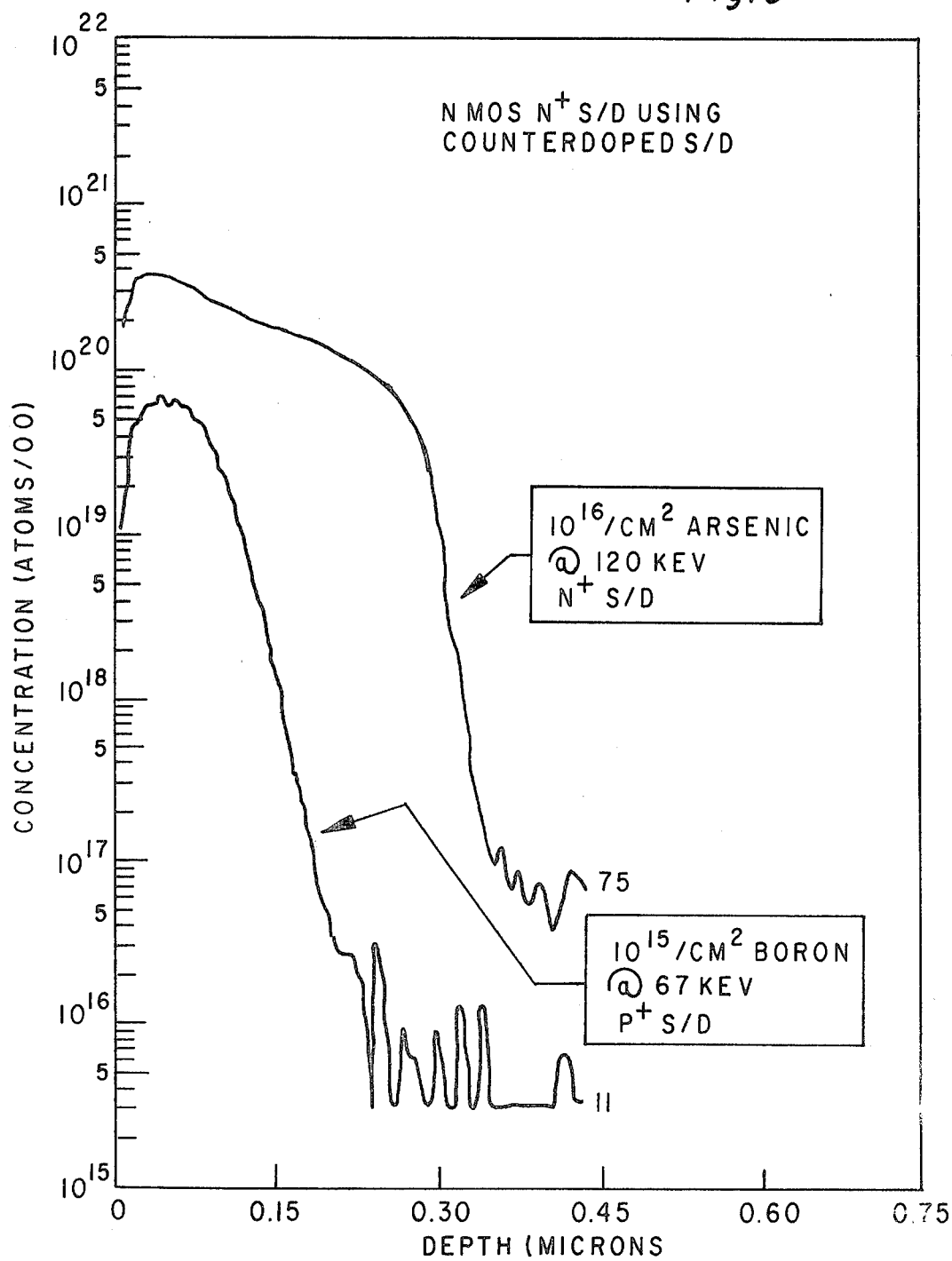
FIG. 3 shows depth profiles of arsenic and boron concentrations within an N-type source/drain region prepared by counterdoping according to the present invention.

FIG. 3 shows characterization results for an N-type source/drain region 18 which was actually prepared using the above techniques. Secondary ion mass spectroscopy was used to prepare a graph of concentration versus depth, for both arsenic and boron. As may be seen, the boron is almost entirely concentrated at depths shallower than 0.15 microns, whereas the arsenic concentration remains heavy down to approximately 0.3 microns. Not only is the arsenic concentration substantially higher than the boron concentration at all depths, but the boron concentration at the N/P junction created by the front of the arsenic diffusion is negligible. (The measurement techniques used prevent measurement of a boron concentration below approximately $4 \times 10^{15}$ per $cm^3$.) Thus, the method of the present invention has served to create a good quality N-type source/drain region 18. Moreover, since the boron diffusion remains totally enclosed by the arsenic diffusion, there is no parasitic DMOS created, and accordingly, no threshold shift.

Figure 4:
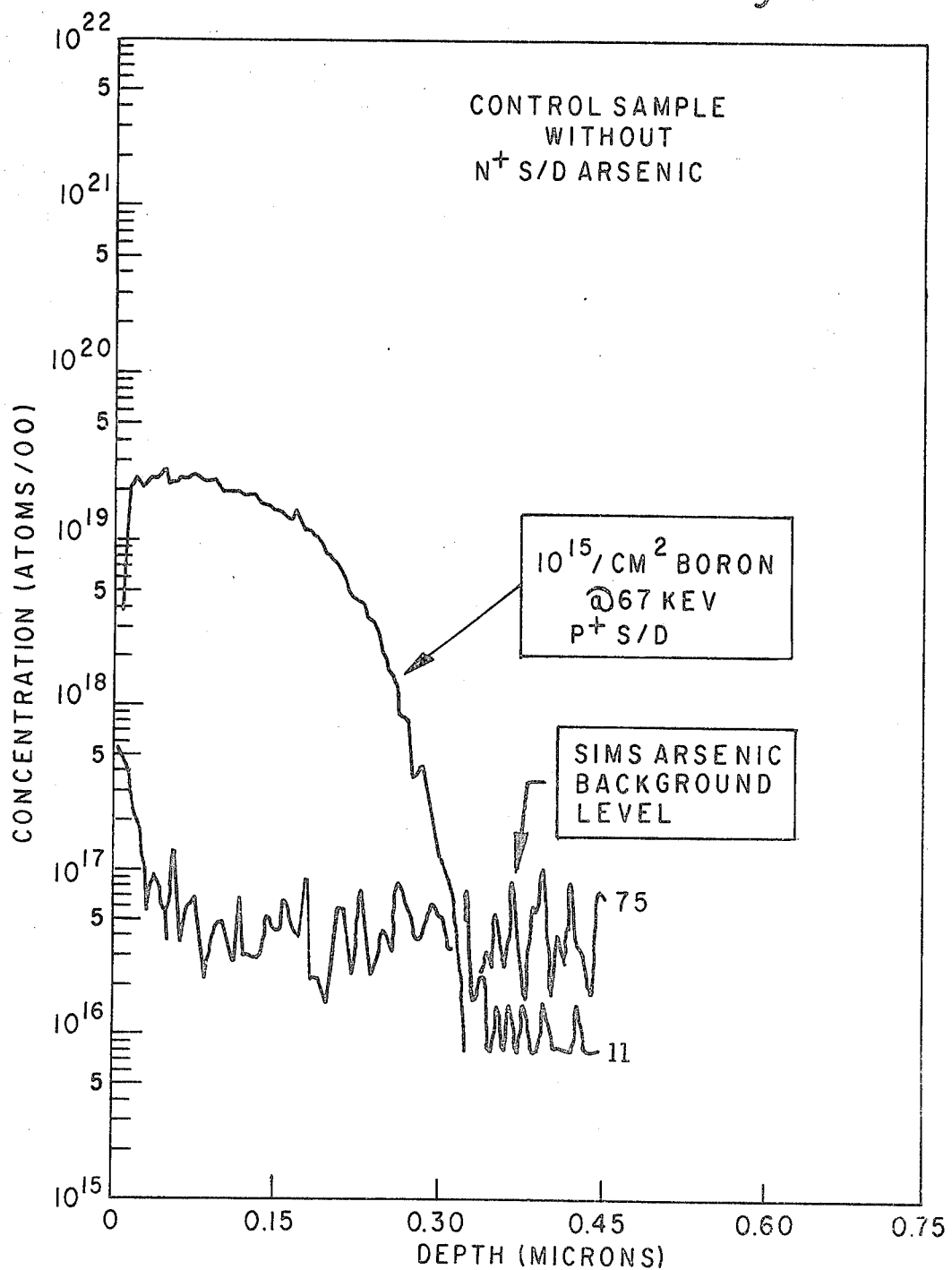
FIG. 4 shows a depth profile of a P-type source/drain region to which only boron implantation and not arsenic implantation has been applied, in accordance with the present invention.

A concentration versus depth profile was also made, using the same measurement techniques, for a region (such as the P-type source/drain regions 16) where only boron has been implanted. As comparison of FIGS. 3 and 4 shows, the same dose of boron, if arsenic is absent, will diffuse down to about 0.3 microns. If a P-type dopant having such a final concentration versus depth profile were used in combination with an N-type dopant having a concentration versus depth profile like that shown for arsenic in FIG. 3, there would therefore be danger of a parasitic DMOS channel being created near 0.3 microns depth, causing variable or undesired device characteristics.

Thus, while it would be possible to use (e.g.) phosphorus instead of arsenic as an N-type dopant, the absence of the cooperative doping effects experienced between boron and arsenic would make source/drain counterdoping much less attractive. In addition, a further difficulty is that some combinations of dopants have a cooperative effect opposite to that experienced with arsenic and boron, which is most undesirable. For example, where phosphorus and boron are used, there appears to be some tendency for the junction depth of the boron to be increased by the phosphorus dose. (Intuitively, the phosphorus may be imagined as pushing the boron ahead of it.)

Thus, while the present invention may be practiced with other materials than boron and arsenic, the preferred embodiment uses dopants having a cooperative diffusivity interaction like that between boron and arsenic. See, e.g., Ziegler et al, Discovery of Anomalous Base Regions in Transistors, Applied Physics Letters 1707–1709 (August 1972), which is hereby incorporated by reference.

The usual preferred doping of polysilicon wiring is N+, to facilitate connection to NMOS peripheral circuit elements. Of course, the present invention could also be applied to a structure using P+ polysilicon, in which case an N-type dopant (rather than boron) would be used for the minority dopant, with a P-type majority dopant. Doping for N+ polysilicon wiring is preferably performed by $POCl_3$ doping. For example, a sequence of five minutes in $O_2+N_2$, 50 minutes in $O_2+N_2+POCl_3$, and then another five minutes in $O_2+N_2$, all at 900° C., will induce a sheet resistance of slightly more than 50 ohms per square in a 500 nm polysilicon layer so treated. For a typical gate polysilicon thickness of 500 nm variation of the drive in time and temperature of the $POCl_3$ doping can vary the resulting sheet resistance from around 20 ohms per square up to more than 200 ohms per square. However, if the doping is increased to the point where the sheet resistance is below about 50 ohms per square (i.e. the resistivity is below $2.5 \times 10^{-3}$ ohm-cm), the etching characteristics of the polysilicon degenerate dramatically. The rate of etching increases, the anisotropy of etching is decreased, and, at high dopant levels, etching will occur preferentially along the polysilicon grain boundaries, so that the polysilicon is removed in chunks.

Thus, if the sheet resistance of the polysilicon gates and gate-level-interconnects is maintained above about 50 ohms per square, greatly improved pattern definition is reliably achieved.

The problem is the compensation which may be induced by the P-type source/drain implantation. If the polysilicon is exposed to this implant, the polysilicon doping level must be maintained sufficiently high to avoid excessive compensation.

This is prevented in the present invention by the photoresist caps 26 which remain atop the gates 20 during the boron ion implant. These photoresist caps can easily be retained during the implant step if no additional photoresist process is performed before the implant. Thus, by (1) using a counterdoping scheme for source/drain implants, (2) implanting the minority dopant first, (3) choosing the minority dopant to be the dopant of opposite type to that used to enhance conductivity in the polysilicon gate lines and gate-level interconnect, and (4) leaving the photoresist etch mask layer which was used to pattern the polysilicon gates in place during the minority dopant implant, compensating implantation of the gates is prevented, and the doping level of the polysilicon can be selected optimally in accordance with other criteria, namely conductivity and pattern definition. In the preferred embodiment of the present invention, this is performed by using a blanket implant of boron for the P-type source/drain implant, by doping the polysilicon with POCl$_3$ to about 50 ohms per square, and by using an aluminum-masked arsenic implant to form the N-type source/drain. Of course, the N-type source/drain implant is allowed to strike the polysilicon outside of the areas where P-type devices are located. This further lowers the sheet resistance of the polysilicon in many areas, but, since patterning of the polysilicon has already been completed, additional doping at this late stage of processing has no deleterious effect.

Thus, the present invention permits saving one masking step in the production of any CMOS device, and therefore permits a saving of five to ten percent in the production cost of any CMOS device, while also permitting the use of optimally doped polysilicon.

The present disclosure has been most specifically directed to the primary preferred embodiment, wherein both boron and arsenic are used as dopants in silicon, but the concepts of the present invention are also applicable to other dopants and materials, and the scope of the invention is expressly not limited by the scope of the preferred embodiment discussed.

What we claim is:

1. A process for forming both first-conductivity-type-channel and second-conductivity-type-channel transistors in respective selected areas of a semiconductor surface, said transistors each respectively comprising a gate, a source, and a drain, said process comprising the steps of:

providing a layer of doped first-conductivity-type polysilicon atop said semiconductor surface;

applying a patterned etch mask layer atop said polysilicon layer, said patterned etch mask layer overlying the respective selected locations of said respective gates of said transistors;

anisotropically etching said polysilicon layer except where said polysilicon layer is covered by a portion of said patterned etch mask layer;

implanting a second-conductivity-type dopant in the respective desired locations both of the respective sources and drains both of said second-conductivity-type-channel transistors and one of said first-conductivity-type-channel transistors, said patterned etch mask layer not being removed before said second-type implanting step; and implanting a first-conductivity-type dopant in the respective desired locations of said respective sources and drains of said first-type-channel transistors, said first-type dopant being applied at a higher dose than said second-type dopant;

wherein said first- and second-type dopants are such that the presence of said first-type dopant within said semiconductor surface reduces the diffusivity of said second-type dopant.

2. The method of claim 1, wherein said doped polysilicon layer has a resistivity not less than $2.5 \times 10^3$ ohm-cm.

3. The method of claim 1, wherein said second-type dopant is boron, and said first-type dopant is arsenic.

4. The method of claim 3, wherein said patterned mask layer is removed before said first-type implanting step, and wherein said first-type implanting step comprises applying an aluminum mask atop said respective sources and drains of said second-conductivity-type-channel transistors, and then implanting arsenic into said respective sources and drains of said first-conductivity-type transistors.

5. The method of claim 1, wherein said second-type implantation is applied at a lower energy than said first-type implantation.

6. The method of claim 1, wherein said first-type implantation is applied at a dose approximately five times that of said second-type implantation.

7. The method of claim 1, wherein said first-type implantation is applied at an effective energy approximately 10 times that of said second-type implantation.

* * * * *